(12) United States Patent
Weiss et al.

(10) Patent No.: US 9,526,189 B2
(45) Date of Patent: Dec. 20, 2016

(54) POWER ELECTRONIC SWITCHING SYSTEM

(71) Applicant: ABB TECHNOLOGY AG, Zürich (CH)

(72) Inventors: Michael Weiss, Winterthur (CH); Roger Lüscher, Solothurn (CH); Arthouros Iordanidis, Baden (CH); Bogdan Cranganu-Cretu, Fislisbach (CH); Jürgen Steinke, Albbruck (DE)

(73) Assignee: ABB Schweiz AG, Baden (CH)

( * ) Notice: Subject to any disclaimer, the term of this patent is extended or adjusted under 35 U.S.C. 154(b) by 551 days.

(21) Appl. No.: 14/053,204

(22) Filed: Oct. 14, 2013

(65) Prior Publication Data

US 2014/0043774 A1 Feb. 13, 2014

Related U.S. Application Data

(63) Continuation of application No. PCT/EP2012/054899, filed on Mar. 20, 2012.

(30) Foreign Application Priority Data

Apr. 14, 2011 (DE) .................... 20 2011 005 290 U
May 3, 2011 (DE) .................... 20 2011 100 208 U

(51) Int. Cl.
*H05K 7/14* (2006.01)

(52) U.S. Cl.
CPC ........... *H05K 7/1411* (2013.01); *H05K 7/1432* (2013.01); *H05K 7/1457* (2013.01); *H05K 7/1471* (2013.01); *H05K 7/1474* (2013.01)

(58) Field of Classification Search
CPC .................................................. H05K 7/1411
(Continued)

(56) References Cited

U.S. PATENT DOCUMENTS 4,685,032 A * 8/1987 Blomstedt ............ H05K 7/1457
                                                                    361/624
4,738,632 A * 4/1988 Schmidt ............... H05K 7/1441
                                                                    361/729
(Continued)

FOREIGN PATENT DOCUMENTS

DE       140 964 A1    4/1980
DE       91 04 384 U1  6/1991
(Continued)

OTHER PUBLICATIONS

International Search Report (PCT/ISA/210) mailed on Sep. 27, 2012, by the European Patent Office as the International Searching Authority for International Application No. PCT/EP2012/054899.
(Continued)

*Primary Examiner* — David Warren
(74) *Attorney, Agent, or Firm* — Taft Stettinius & Hollister LLP

(57) ABSTRACT

An exemplary power-electronic switching system has a plurality of switching units, wherein each switching unit includes a housing and at least one switching module which is arranged within the housing. A mounting unit has a holding apparatus, on which the housings of the switching units are arranged. The holding apparatus includes an insulation material for electrically insulating the holding apparatus from the housings of the switching units and the housings of the switching units from one another. The insulation material allows the housings of the switching units of the switching system to have different voltage potentials from one another and additionally can be realized in a simple and space-saving manner and easily be assembled. In addition, the housing of each switching unit includes a material for at least partially shielding an electric and magnetic field.

20 Claims, 7 Drawing Sheets

(58) Field of Classification Search
USPC .................................................. 361/730, 732
See application file for complete search history.

(56) References Cited

U.S. PATENT DOCUMENTS

| | | | | | |
|---|---|---|---|---|---|
| 5,655,922 | A | * | 8/1997 | Dux | ..................... H05K 7/1478 439/213 |
| 5,978,212 | A | * | 11/1999 | Boulay | ................... G06F 1/184 292/19 |
| 6,218,792 | B1 | | 4/2001 | Berth et al. | |
| 6,304,448 | B1 | | 10/2001 | Fukada et al. | |
| 6,356,441 | B1 | * | 3/2002 | Claprood | ................ G06F 1/184 312/332.1 |
| 6,654,255 | B2 | * | 11/2003 | Kruse | .................... H04Q 1/023 174/480 |
| 7,035,115 | B2 | * | 4/2006 | Walesa | ................ H01R 25/164 307/147 |
| 8,207,693 | B2 | * | 6/2012 | Hauser | ................... A01D 34/78 318/34 |
| 2004/0201972 | A1 | | 10/2004 | Walesa | |
| 2006/0067042 | A1 | * | 3/2006 | Salinas | ................ H05K 7/1409 361/679.37 |
| 2007/0187126 | A1 | * | 8/2007 | Liang | ................... H05K 7/1411 174/50 |
| 2007/0247818 | A1 | * | 10/2007 | Canfield | .............. H05K 7/1411 361/728 |
| 2008/0180909 | A1 | | 7/2008 | Illerhaus et al. | |
| 2009/0080147 | A1 | | 3/2009 | Kunkle et al. | |
| 2009/0225500 | A1 | * | 9/2009 | Cherney | .............. H05K 7/1432 361/622 |
| 2014/0043774 | A1 | * | 2/2014 | Weiss | ................... H05K 7/1432 361/732 |

FOREIGN PATENT DOCUMENTS

| | | |
|---|---|---|
| DE | 197 44 827 A1 | 4/1999 |
| DE | 198 41 132 A1 | 3/2000 |
| DE | 100 54 962 A1 | 9/2001 |
| EP | 1 953 908 A2 | 8/2008 |
| WO | WO 2008/005485 A2 | 1/2008 |

OTHER PUBLICATIONS

Written Opinion (PCT/ISA/237) mailed on Sep. 27, 2012, by the European Patent Office as the International Searching Authority for International Application No. PCT/EP2012/054899.

English Language Translation of Notification of Transmittal of Translation of the International Preliminary Report on Patentability (Form PCT/IB/338 and PCT/IB/373) and the Written Opinion of the International Searching Authority (Form PCT/ISA/237) issued on Aug. 21, 2013, by the International Bureau of WIPO for International Application No. PCT/EP2012/054899. (10 pages).

* cited by examiner

POWER ELECTRONIC SWITCHING SYSTEM

RELATED APPLICATION(S)

This application claims priority as a continuation application under 35 U.S.C. §120 to International Application PCT/EP2012/054899, which was filed on Mar. 20, 2012, designating the U.S., and claiming priority to German Application 20 2011 005 290.7 filed in Germany on Apr. 14, 2011 and German Application 20 2011 100 208.3 filed in Germany on May 3, 2011. The content of each prior application is hereby incorporated by reference in its entirety.

FIELD

The present disclosure refers to the field of power electronics, and particularly to power-electronic switching system having electrically insulating material.

BACKGROUND INFORMATION

Known power-electronic switching systems can be found in converter circuits for an extremely wide variety of applications. A power-electronic switching system of this kind can includes a large number of switching units and a mounting unit, wherein the mounting unit has a holding apparatus on which the housings of the switching units are arranged. A power-electronic switching system of this type is disclosed in WO 2008/005485 A2. As shown in FIGS. 5A and 5B, the holding apparatus has a plurality of rails wherein two such rails always carry a housing and the housing is fixed on said rails. The mounting unit, the holding apparatus, and the rails can be composed of metal and therefore of an electrically conducting material. A switching unit of this kind can include the above-mentioned housing in which at least one switching module is arranged, said switching module for its part including one or more power semiconductor switches which can be driven. When there are a plurality of power semiconductor switches which can be driven, they are interconnected, for example, to form a half-bridge circuit or a full-bridge circuit. Each switching module is connected to the associated housing, wherein the switching modules and the housings are then usually at a uniform voltage potential, for example, ground potential.

One characteristic of the power-electronic switching system of WO 2008/005485 A2 is that the housings of the switching units have to be at a uniform voltage potential, otherwise undesired compensation currents would be generated. The power-electronic system of WO 2008/005485 A2, however, would likely not be capable of supporting an application in which the housings of the switching units are set at different voltage potentials, for example. Furthermore, the design of the power-electronic switching system of WO 2008/005485 A2 is complex and can call for a large space since each switching unit specifies two rails which additionally have to be attached to a frame structure. Therefore, production specification of a known power-electronic switching system of this type can be complex, call for a large amount of time and experience in respect of mounting, and can therefore be expensive.

SUMMARY

An exemplary power-electronic switching system is disclosed, comprising: a plurality of switching units, each switching unit including: a housing; at least one switching module which is arranged within the housing; and a mounting unit, wherein the mounting unit has a holding apparatus, on which the housings of the switching units are arranged, wherein the holding apparatus includes an insulation material for electrically insulating the holding apparatus from the housings of the switching units and the housings of the switching units from one another, and the housing of each switching unit includes a material for at least partially shielding an electric and magnetic field.

Figure 1:
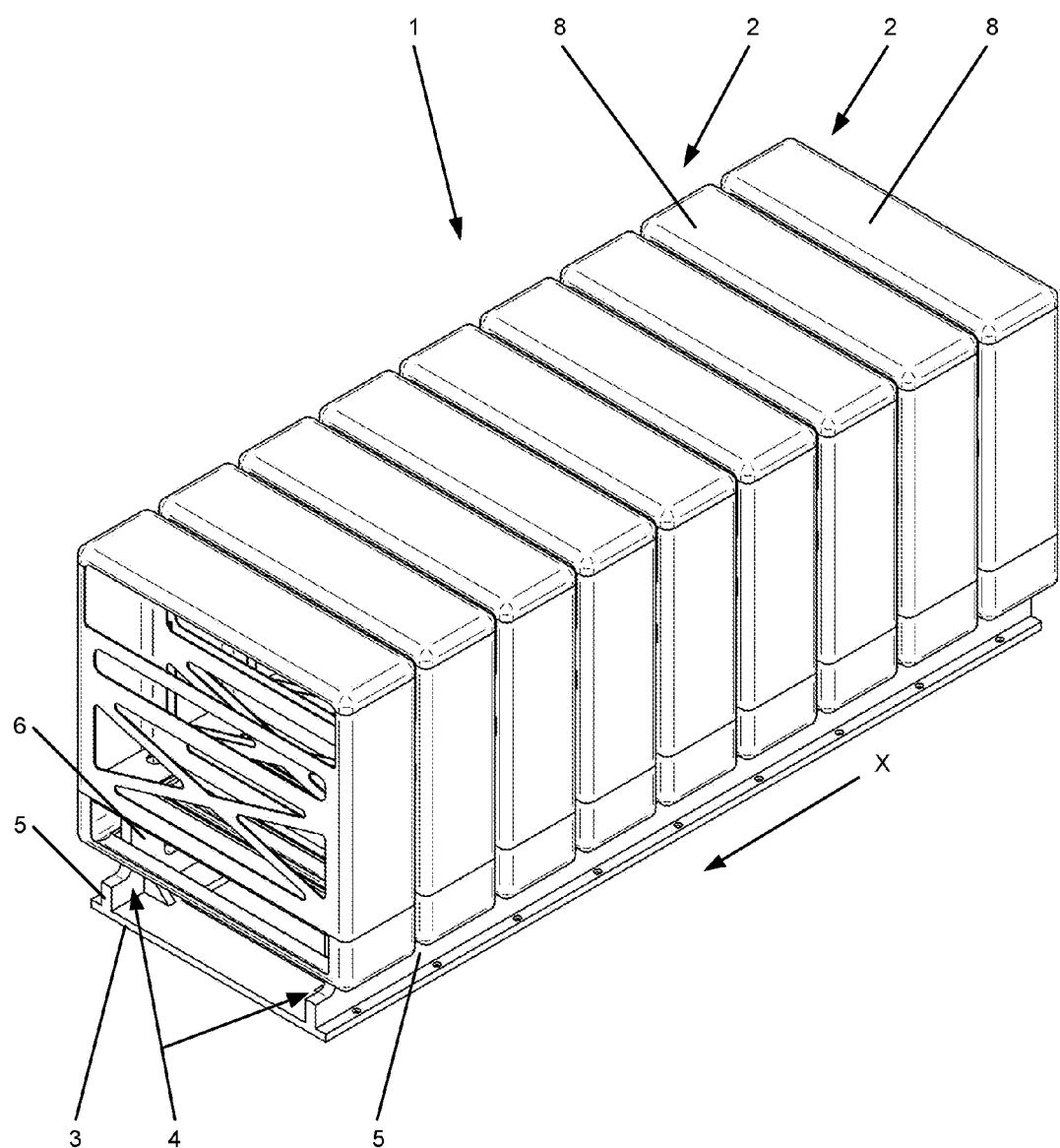
FIG. 1 shows a three-dimensional schematic of a power-electronic switching system according to an exemplary embodiment of the disclosure.

The reference symbols used in the drawing and the meaning of said reference symbols are listed in summarized form in the list of reference symbols. In principle, identical parts are provided with identical reference symbols in the Figures. The described embodiments are merely examples of the subject matter of the disclosure and do not have a limiting effect.

DETAILED DESCRIPTION

Exemplary embodiments of the present disclosure specify a power-electronic switching system which allows the housings of the switching units of the switching system to have different voltage potentials from one another and which additionally can be realized in a simple and space-saving manner and can be assembled without problems.

An exemplary power-electronic switching system according to the present disclosure can include a large number of switching units, wherein each switching unit has a housing and at least one switching module which is arranged within the housing. The power-electronic switching system further includes a mounting unit, wherein the mounting unit has a holding apparatus, on which holding apparatus the housings of the switching units are arranged. According to another exemplary embodiment of the disclosure, the holding apparatus can include an insulation material for electrically insulating the holding apparatus from the housings of the switching units and the housings of the switching units from one another. In addition, the housing of each switching unit includes a material for at least partially shielding an electric and magnetic field.

This holding apparatus can have the advantageous effect that the housings of the switching units can be at different voltage potentials to one another without undesirable compensation currents flowing. The holding apparatus advantageously also prevents possible partial discharges which can occur on account of the abovementioned different voltage potentials. Furthermore, an exemplary power-electronic switching system according to the present disclosure can have a simple and space-saving design owing to the mounting unit and its holding apparatus since the holding apparatus can hold a plurality of switching units. In addition, the power-electronic switching system can be robust owing to the mounting unit and its holding apparatus. Furthermore, an exemplary power-electronic switching system disclosed herein can be realized and produced quickly and without problems since the outlay on mounting is low and can be assembled without a great deal of experience. Consequently, an exemplary power-electronic switching system according to the present disclosure is cost-effective in respect of production. Furthermore, the housing of each switching unit can serve to at least partially shield or attenuate electric and magnetic fields which can originate from the at least one switching module within the housing, and can also serve to at least partially shield or attenuate electric and magnetic fields which can be present outside the housing, for example caused by adjacent switching units and/or peripheral electrical components.

These and further objects, advantages and features of exemplary embodiments of the present disclosure will become obvious from the following detailed description of preferred exemplary embodiments of the disclosure in conjunction with the drawings.

Figure 2:
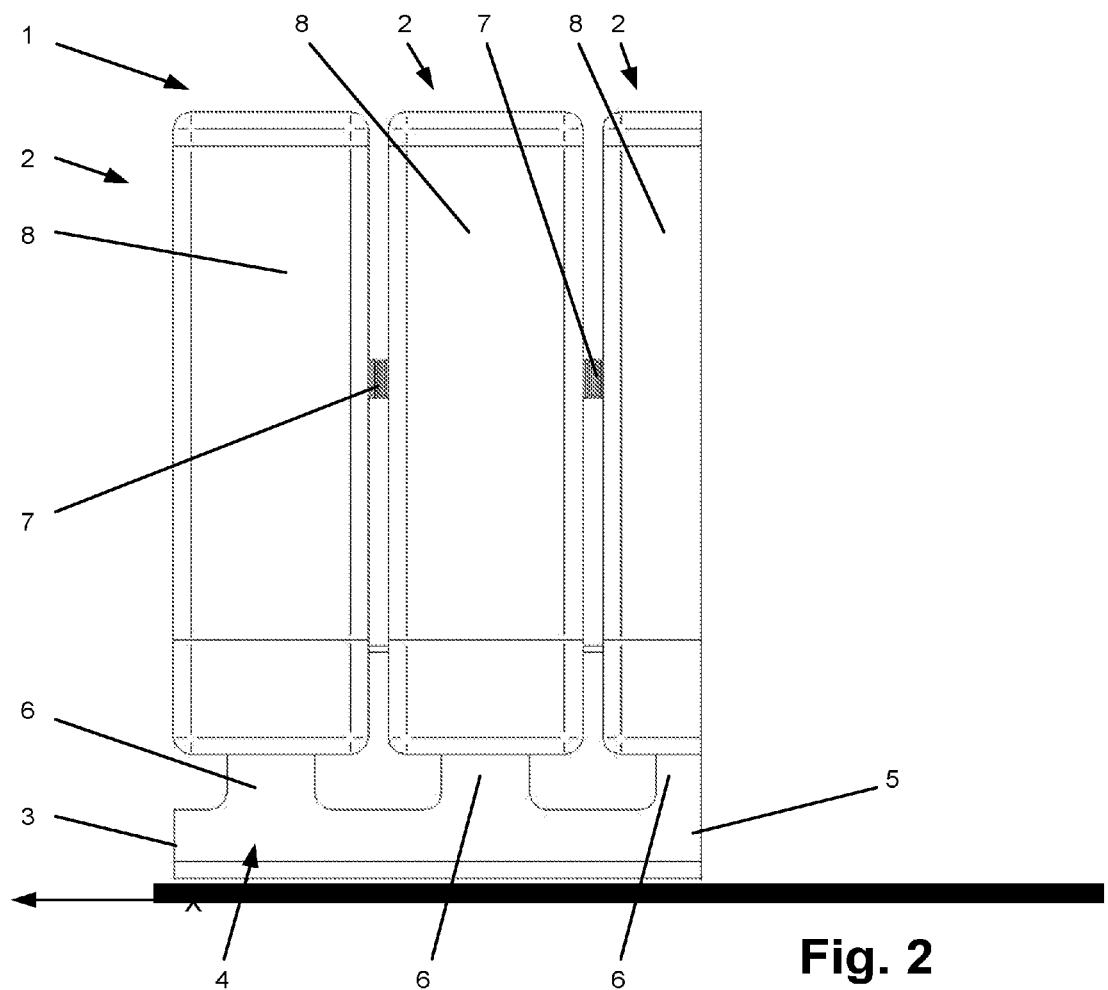
FIG. 2 shows a front view of the power-electronic switching system shown in FIG. 1 according to an exemplary embodiment of the disclosure.
Figure 3:
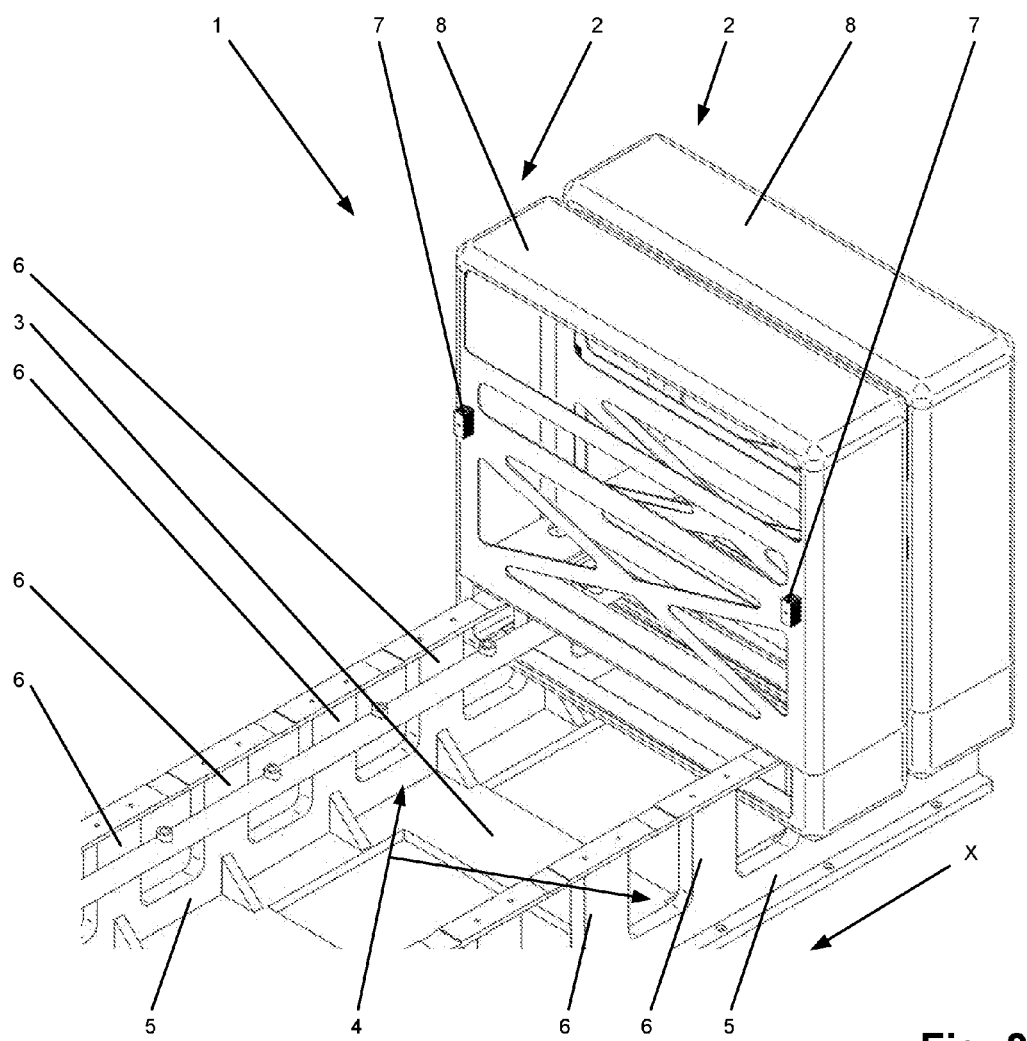
FIG. 3 shows details of the three-dimensional schematic of the power-electronic switching system shown in FIG. 1 according to an exemplary embodiment of the disclosure.
Figure 4:
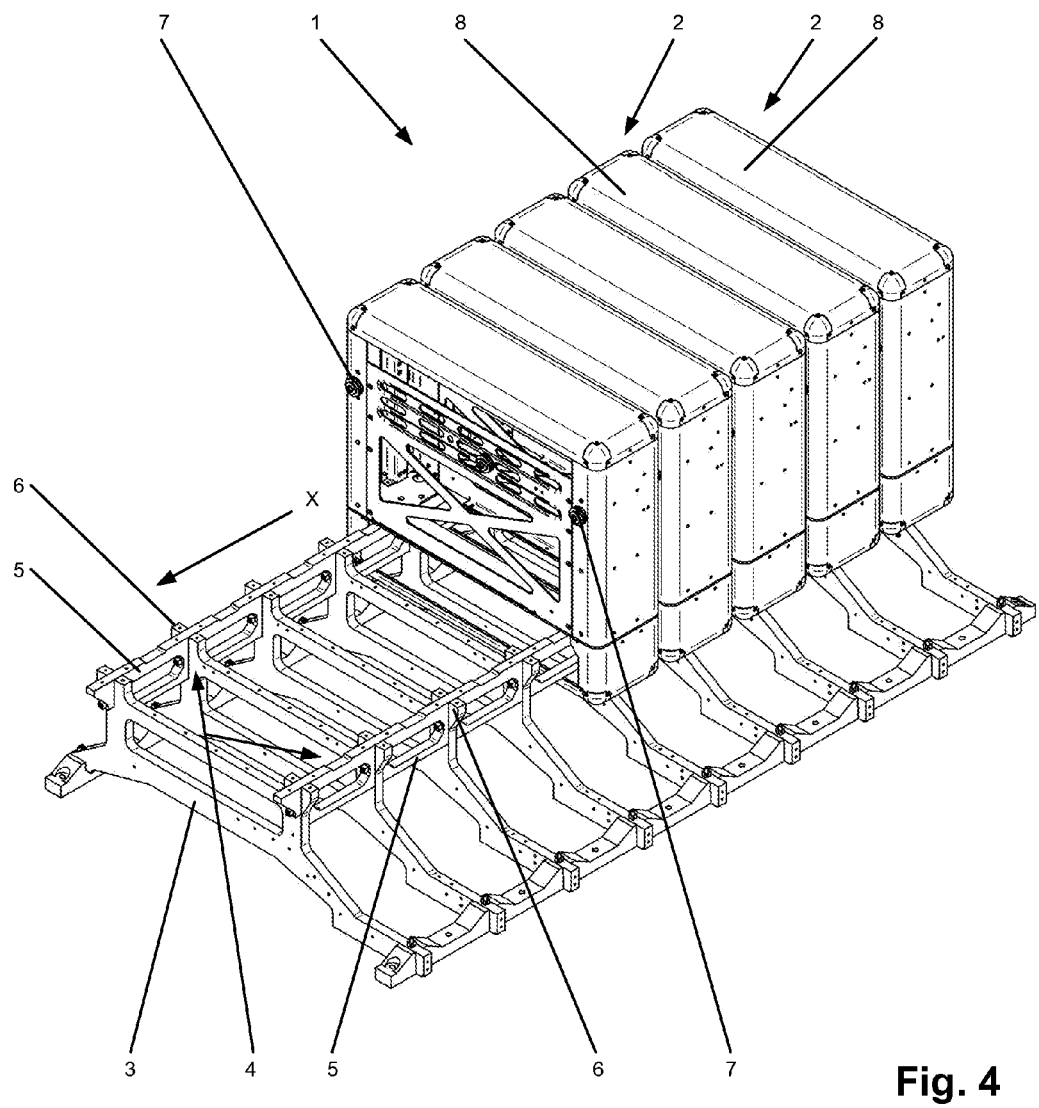
FIG. 4 shows a three-dimensional schematic of a second power-electronic switching system according to an exemplary embodiment of the disclosure.
Figure 5:
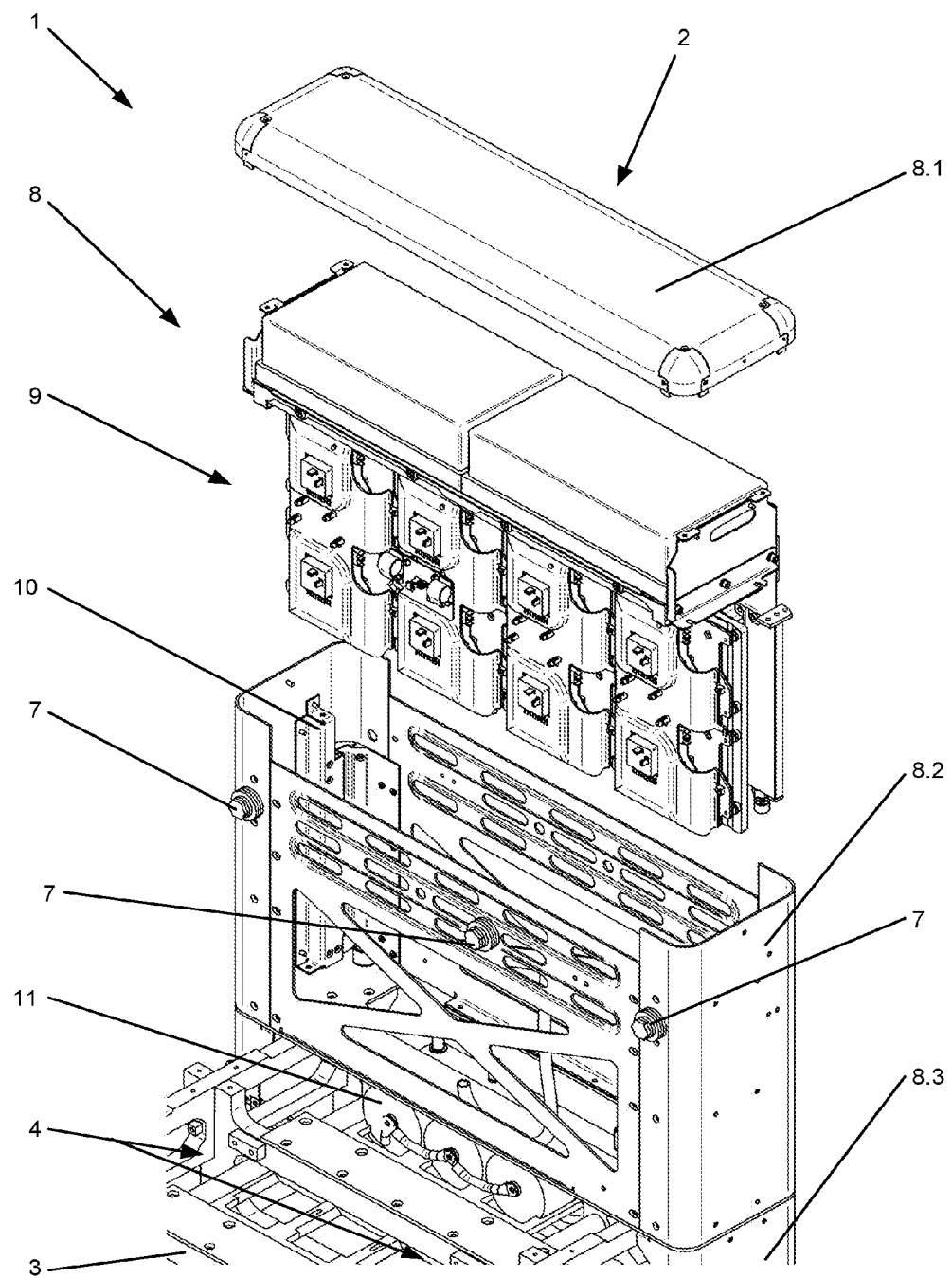
FIG. 5 shows an exploded illustration of the power-electronic switching system shown in FIG. 4 according to an exemplary embodiment of the disclosure.
Figure 6:
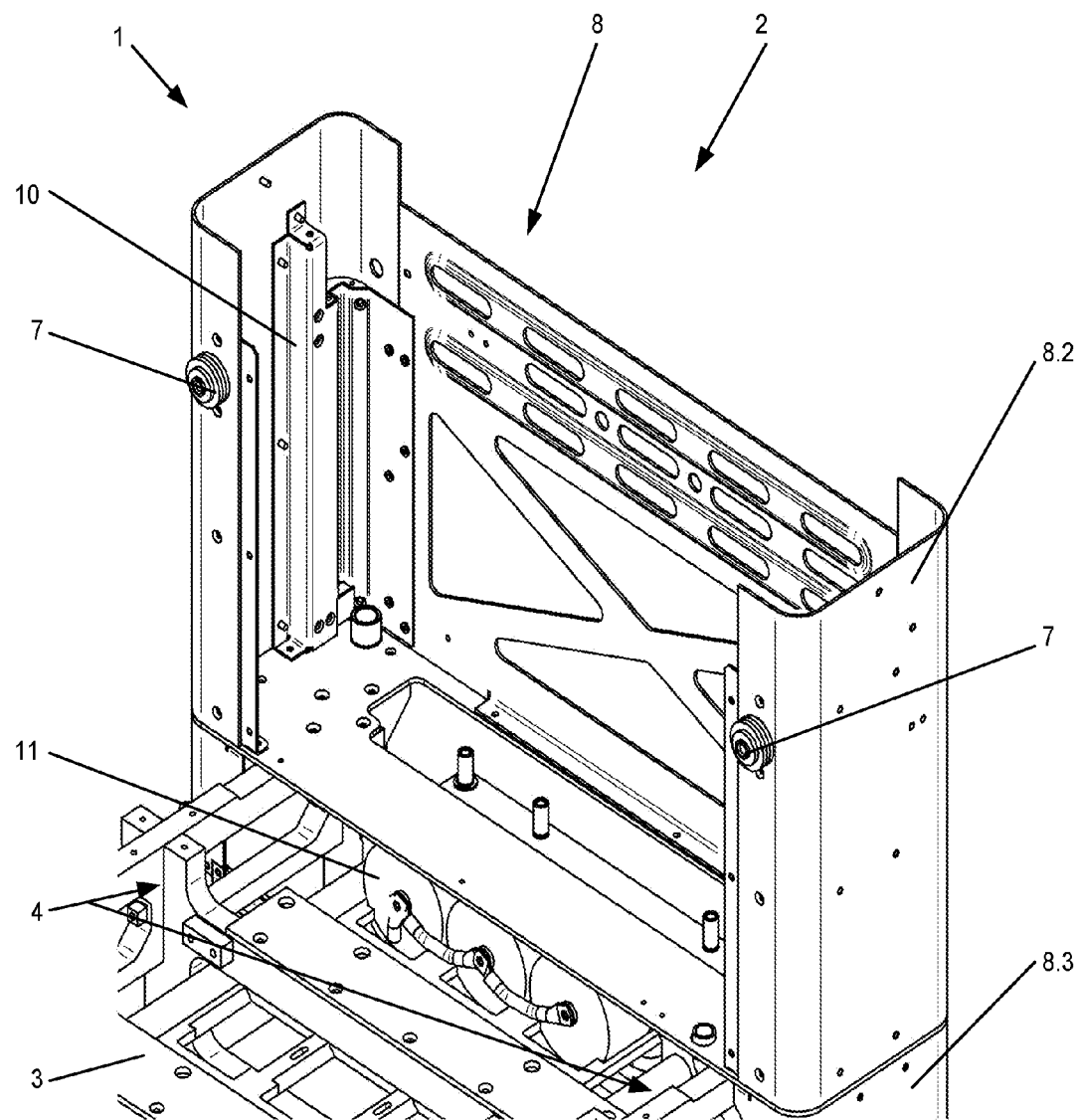
FIG. 6 shows details of the three-dimensional schematic of the power-electronic switching system shown in FIG. 4 according to an exemplary embodiment of the disclosure.
Figure 7:
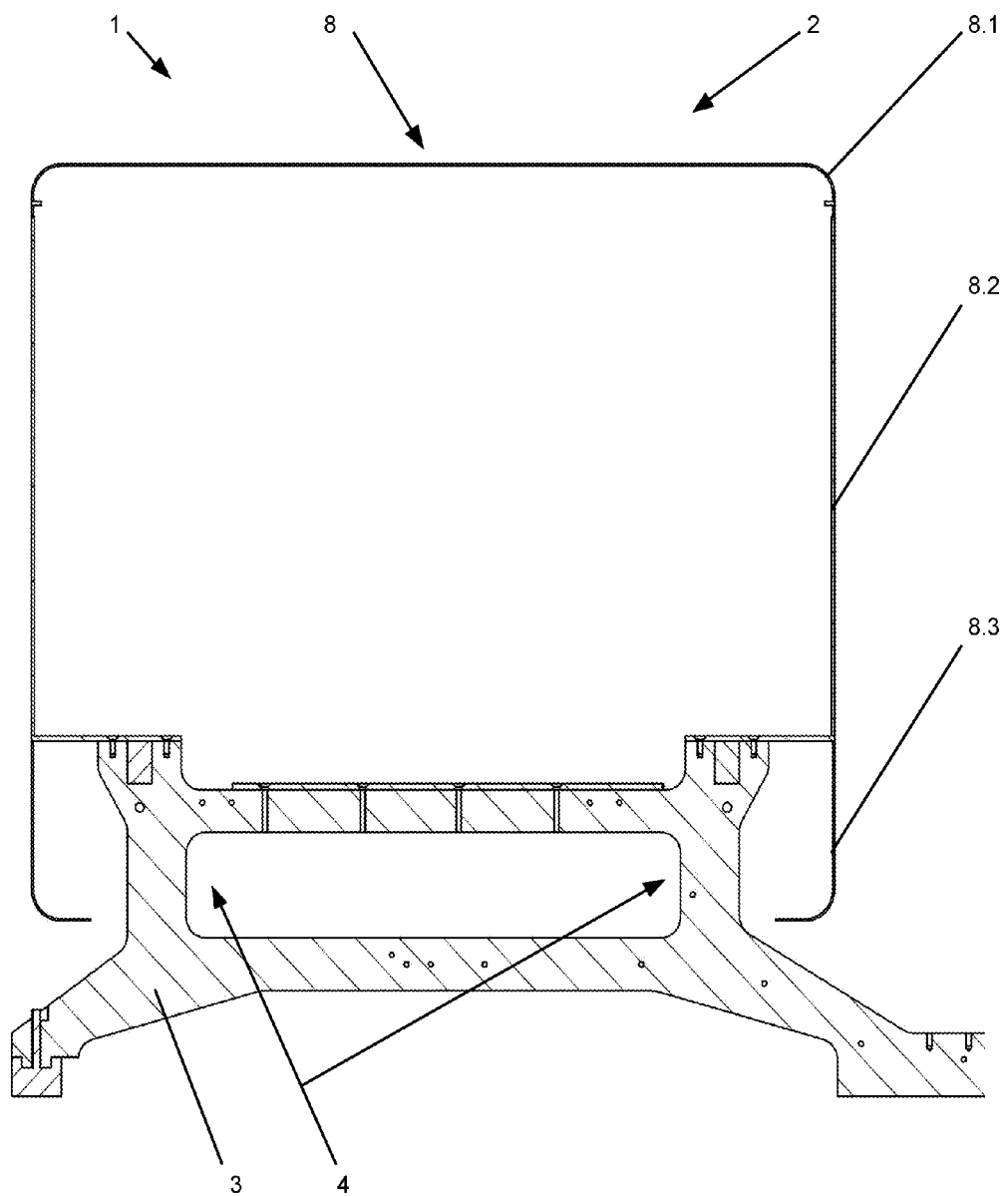
FIG. 7 shows a sectional illustration of the power-electronic switching system shown in FIG. 4 according to an exemplary embodiment of the disclosure.

Exemplary embodiments are described in conjunction with the Figures, of which FIG. 1 shows a three-dimensional schematic of a power-electronic switching system according to an exemplary embodiment of the disclosure; Furthermore, FIG. 2 shows a front view of the power-electronic switching system shown in FIG. 1 according to an exemplary embodiment of the disclosure; Furthermore, FIG. 3 shows a three-dimensional schematic of the power-electronic switching system shown in FIG. 1 according to an exemplary embodiment of the disclosure; FIG. 4 shows a three-dimensional schematic of a second power-electronic switching system according to an exemplary embodiment of the disclosure; FIG. 5 shows an exploded illustration of the power-electronic switching system shown in FIG. 4 according to an exemplary embodiment of the disclosure; FIG. 6 shows another three-dimensional schematic of the power-electronic switching system shown in FIG. 4 according to an exemplary embodiment of the disclosure; and FIG. 7 shows a sectional illustration of the power-electronic switching system shown in FIG. 4 according to an exemplary embodiment of the disclosure.

As shown in the figures, where applicable, the power-electronic switching system 1 includes a large number of switching units 2, wherein each switching unit 2 has a housing 8 and at least one switching module 9 which is arranged within the housing 8. The at least one switching module 9 is not illustrated in FIG. 1, FIG. 2, FIG. 3, FIG. 4, FIG. 6 and FIG. 7 for reasons of clarity. The switching module 9 can include one or more power semiconductor switches. When there are a plurality of drivable power semiconductor switches the switches can be interconnected, for example, to form a half-bridge circuit or a full-bridge circuit. One of skill in the art would recognize specified connections of the drivable power semiconductor switches that are feasible for implementation in the exemplary embodiments described herein. The exemplary drivable power semiconductor switch can be designed, for example, as a turn-off thyristor (GTO—Gate Turn-Off Thyristor), or as an integrated thyristor with a commutated drive electrode (IGCT—Integrated Gate Commutated Thyristor), each with a diode that is connected back-to-back in parallel. However, in another exemplary embodiment a drivable power semiconductor switch, for example, can be a power MOSFET with a diode which can be additionally connected back-to-back in parallel or as a bipolar transistor with an insulated gate electrode (IGBT) with a diode which is additionally connected back-to-back in parallel.

As shown in FIG. 1, the power-electronic switching system 1 additionally includes a mounting unit 3, wherein the mounting unit 3 has a holding apparatus 4, on which holding apparatus 4 the housings 8 of the switching units 2 are arranged. The holding apparatus 4 can include an insulation material for electrically insulating the holding apparatus 4 from the housings 8 of the switching units 2 and the housings 8 of the switching units 2 from one another. In addition, the housing 8 of each switching unit 2 includes a material for at least partially shielding an electric and magnetic field.

The holding apparatus 4 has the advantageous effect that the housings 8 of the switching units 2 can be at different voltage potentials to one another without undesirable compensation currents flowing. The holding apparatus 4 additionally serves to prevent possible partial discharges which can occur on account of the abovementioned different voltage potentials. Furthermore, the design of the power-electronic switching system 1 according to the disclosure is very simple and space-saving owing to the mounting unit 3 and its holding apparatus 4 since the holding apparatus 4 can hold a plurality of switching units 2. In addition, the power-electronic switching system 1 is correspondingly robust owing to the mounting unit 3 and its holding apparatus 4. Furthermore, the power-electronic switching system 1 can be realized and produced quickly and without problems since the outlay on mounting is low and it can be assembled without a great deal of experience. Consequently, the power-electronic switching system 1 according to the disclosure is extremely cost-effective in respect of production. Furthermore, the housing 8 of each switching unit 2 advantageously serves to at least partially shield or attenuate electric and magnetic fields which can originate from the at least one switching module 9 within the housing 8, and also serve to at least partially shield or attenuate electric and magnetic fields which can be present outside the housing 8, for example generated by adjacent switching units 2 and/or peripheral electrical components. A metal or a metal alloy is can be used as the material for the housing 8. The housing 8 itself can then be composed of a metal or a metal alloy or both. It is also feasible for a housing structure to be coated with a metal, a metal alloy or with both in order to achieve the abovementioned shielding effect.

It shall be understood that in the context of the exemplary embodiments disclosed herein, the entire mounting unit 3 can be composed of an insulation material.

The housing 8 of each switching unit 2 is of a substantially cuboidal (e.g., cube) shape, wherein the corners and edges of the housing 8 are additionally rounded. Owing to this measure, local increases in the electric field on the surface of the housing 8 can be avoided, with the result that a further improvement can be made in respect of avoiding partial discharges and flashovers. The switching units 2 can accordingly be arranged closer to one another, as a result of which a more compact and more space-saving design of the power-electronic switching system 1 can be achieved.

As shown in FIG. 5, the housing 8 of each switching unit 2 is of multipartite (e.g., multiple part) design, with the result that the at least one switching module 9 can be mounted within the housing 8 and the respective switching unit 2 can be mounted and fixed to the holding apparatus 4 in a simple manner. The housing 8 can include three parts, for example, an upper part 8.1, a central part 8.2, and a lower part 8.3. In other exemplary embodiments only two parts or more than three parts are also feasible. Holding means 10 are provided within the housing 8 of each switching unit 2 for holding the at least one switching module 9. The holding means 10 serves for simply inserting the at least one switching module 9 into the housing 8. The holding means 10 can be a rail or rail-like design. The holding means 10 can additionally also be designed in such a way that they serve to fix the at least one switching module 9 to the inside of the housing 8.

The holding apparatus 4 can include two limbs 5. Each limb 5 has a large number of projections 6 for holding the respective switching unit 2. As shown in FIG. 2, for mounting, the respective switching unit 2 can be plugged onto one projection 6 of each limb 5 and then can be fixed to the associated projections 6 of the limbs 5. The fixing can be performed using plate elements which are indicated in FIG. 3. As shown in FIG. 1, FIG. 2 and FIG. 3, the projections 6 can be arranged in the longitudinal direction X of the respective limb 5. In an exemplary embodiment, the projections 6 of a limb 5 can be spaced apart in an equidistant manner. Furthermore, the number of projections 6 of one limb 5 corresponds to the number of projections 6 of the other limb 5. As shown in FIG. 5, FIG. 6 and FIG. 7, in an exemplary embodiment, the respective switching unit 2 can be fixed between two projections 6 for mounting, wherein the lower part 8.3 of the housing 8 of the switching unit 2 then at least partially surrounds the limbs 5. As shown in FIG. 7, fixing can be performed using plate elements. Furthermore, the limbs 5 can be advantageously arranged substantially parallel to one another.

An electrical energy store 11 can be provided for each switching unit 2, as shown by way of example in FIG. 5 and FIG. 6. The electrical energy store 11 is connected to the at least one switching module 9 of the associated switching unit 2. The electrical energy store and the at least one switching module are not illustrated in FIG. 1, FIG. 2, FIG. 3, FIG. 4 and FIG. 7 for reasons of clarity. For shielding purposes, the respective electrical energy store 11 is optionally also surrounded by the housing 8 of the respective switching unit 2 and therefore arranged within the housing 8, as illustrated in FIG. 5 and FIG. 6.

According to FIGS. 1 to 6, the switching units 2 can be arranged next to one another along the two limbs 5, wherein respectively adjacent switching units 2, for example, adjacent housings 8 of the switching units 2, are separated from one another and connected to one another by means of at least one spacer element 7. The spacer element 7 can include an insulation material for electrically insulating the switching units 2 which are connected to the spacer element 7. Accordingly, the spacer element 7 serves firstly to electrically insulate adjacent switching units 2 from one another and secondly to fix adjacent switching units 2 to one another, thereby producing a compact combination of the switching units 2 which is extremely highly insensitive to mechanical vibrations and is therefore robust overall. The switching system 1 according to the disclosure can therefore be suitable for applications in a harsh environment and is, for example, intended for traction applications.

In an exemplary embodiment of the present disclosure, the mounting unit 3 can be an integral design. For example, the mounting unit 3 can be produced in a very simple manner, for example, by casting, or by another shaping process for an insulation material.

The housing 8 of each switching unit 2 according to the exemplary embodiments described herein and shown in FIG. 1 to FIG. 6 can have a large number of openings. These openings serve firstly to cool the at least one switching module 9 which is arranged within the respective housing 8, for example using air. Secondly, the openings can also be used to provide supply, connecting, and/or control lines to the at least one switching module 9. Furthermore, the openings allow easy access to the interior of the housing 8 for maintenance purposes and/or for mounting the at least one switching module 9 within the housing 8.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 Power-electronic switching system
2 Switching unit
3 Mounting unit
4 Holding apparatus
5 Limb
6 Projection
7 Spacer element
8 Housing of the switching unit
8.1 Upper part of the housing of the switching unit
8.2 Central part of the housing of the switching unit
8.3 Lower part of the housing of the switching unit
9 Switching module
10 Holding means
11 Electrical energy store

What is claimed is:
1. A power-electronic switching system comprising:
a plurality of switching units, each switching unit including:
a housing;
at least one switching module which is arranged within the housing; and
a mounting unit, wherein the mounting unit has a holding apparatus, on which the housings of the switching units are arranged,
wherein the holding apparatus includes an insulation material for electrically insulating the holding apparatus from the housings of the switching units and the housings of the switching units from one another, and
the housing of each switching unit includes a material for at least partially shielding an electric and magnetic field,
wherein the holding apparatus includes two limbs for fixing the respective housing of the switching unit to the holding apparatus, and
wherein the switching units are arranged next to one another along the two limbs, wherein adjacent switching units are separated from one another and connected to one another by means of at least one spacer element.

2. The power-electronic switching system as claimed in claim 1, wherein the housing of each switching unit has a substantially cube shape, wherein the corners and edges of the housing are rounded.

3. The power-electronic switching system as claimed in claim 2, wherein holding means are provided within the housing of each switching unit for holding the at least one switching module.

4. The power-electronic switching system as claimed in claim 1, wherein the housing of each switching unit is of multipartite design.

5. The power-electronic switching system as claimed in claim 1, wherein holding means are provided within the housing of each switching unit for holding the at least one switching module.

6. The power-electronic switching system as claimed in claim 5, wherein the holding means are rails or rail-like.

7. The power-electronic switching system as claimed in claim 1, wherein the limbs are arranged substantially parallel to one another.

8. The power-electronic switching system as claimed in claim 1, wherein the spacer element includes an insulation material for electrically insulating the switching units which are connected to the spacer element.

9. The power-electronic switching system as claimed in claim 8, wherein the mounting unit is an integral design.

10. The power-electronic switching system as claimed in claim 1, wherein the housing of each switching unit has a plurality of openings.

11. The power-electronic switching system as claimed in claim 1, wherein an electrical energy store is provided for each switching unit, said electrical energy store being connected to the at least one switching module of the associated switching unit.

12. The power-electronic switching system as claimed in claim 11, wherein the electrical energy store is arranged within the housing of the associated switching unit.

13. The power-electronic switching system as claimed in claim 12, wherein holding means are provided within the housing of each switching unit for holding the at least one switching module,
wherein the holding means are rails or rail-like, and
wherein the limbs are arranged substantially parallel to one another.

14. The power-electronic switching system as claimed in claim 13, wherein the housing of each switching unit has a substantially cube shape, wherein the corners and edges of the housing are rounded, and
wherein the spacer element includes an insulation material for electrically insulating the switching units which are connected to the spacer element.

15. A power-electronic switching system comprising:
a plurality of switching units, each switching unit including:
a housing;
at least one switching module which is arranged within the housing; and
a mounting unit, wherein the mounting unit has a holding apparatus, on which the housings of the switching units are arranged,
wherein the holding apparatus includes an insulation material for electrically insulating the holding apparatus from the housings of the switching units and the housings of the switching units from one another, and
the housing of each switching unit includes a material for at least partially shielding an electric and magnetic field,
wherein an electrical energy store is provided for each switching unit, said electrical energy store being connected to the at least one switching module of the associated switching unit.

16. The power-electronic switching system as claimed in claim 15, wherein the electrical energy store is arranged within the housing of the associated switching unit.

17. The power-electronic switching system as claimed in claim 15, wherein the holding apparatus includes two limbs for fixing the respective housing of the switching unit to the holding apparatus.

18. A power-electronic switching system comprising:
a plurality of switching units, each switching unit including:
a housing;
at least one switching module which is arranged within the housing; and
a mounting unit, wherein the mounting unit has a holding apparatus, on which the housings of the switching units are arranged,
wherein the holding apparatus includes an insulation material for electrically insulating the holding apparatus from the housings of the switching units and the housings of the switching units from one another, and
the housing of each switching unit includes a material for at least partially shielding an electric and magnetic field,
wherein the housing of each switching unit has a substantially cube shape, wherein the corners and edges of the housing are rounded,
wherein the holding apparatus includes two limbs for fixing the respective housing of the switching unit to the holding apparatus,
wherein the limbs are arranged substantially parallel to one another, and
wherein the switching units are arranged next to one another along the two limbs, wherein adjacent switching units are separated from one another and connected to one another by means of at least one spacer element.

19. The power-electronic switching system as claimed in claim 18, wherein the spacer element includes an insulation material for electrically insulating the switching units which are connected to the spacer element.

20. The power-electronic switching system as claimed in claim 19, wherein the mounting unit is an integral design.

* * * * *